(12) United States Patent
Sato et al.

(10) Patent No.: US 6,345,002 B1
(45) Date of Patent: Feb. 5, 2002

(54) RAS MONITOR CIRCUIT AND FIELD MEMORY USING THE SAME

(75) Inventors: Kenji Sato; Osamu Kuroki, both of Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/667,683

(22) Filed: Sep. 22, 2000

(51) Int. Cl.[7] .................................................. G11C 7/00
(52) U.S. Cl. ........................................ 365/193; 365/236
(58) Field of Search .................................. 365/193, 236

(56) References Cited

U.S. PATENT DOCUMENTS 5,475,645 A * 12/1995 Wada .......................... 365/222
5,559,753 A * 9/1996 Kocis .......................... 365/236
5,680,591 A * 10/1997 Kansal et al. ................ 365/193
6,023,440 A * 2/2000 Kotani et al. ........... 365/230.03
6,076,172 A * 6/2000 Kimura et al. ................. 714/24

* cited by examiner

*Primary Examiner*—Richard Elms
*Assistant Examiner*—Van Thu Nguyen
(74) *Attorney, Agent, or Firm*—Rabin & Berdo, P.C.

(57) ABSTRACT

A field memory includes a DRAM core, a processor that generates and supplies a RAS control signal to the DRAM core, and a RAS cycle monitor circuit. The RAS cycle monitor circuit includes a counter circuit that counts the number of cycles of a RAS control signal supplied to a DRAM core in a predetermined period of time, and a monitor circuit that detects whether the number of cycles of the RAS control signal is within a normal operating range. The monitor circuit supplies a monitor output signal to indicate whether the RAS control signal is being generated on a proper cycle.

48 Claims, 13 Drawing Sheets

RAS MONITOR CIRCUIT AND FIELD MEMORY USING THE SAME

TECHNICAL FIELD OF THE INVENTION

The present invention relates to a field memory using a DRAM core accessed in accordance with RAS control signals generated in the integrated circuit.

BACKGROUND OF THE INVENTION

Conventionally, in a field memory, a DRAM core is not controlled with an external signal but is controlled in accordance with internal signals. Self-refreshing process is also controlled by internal signals, generated inside the integrated circuit. According to such a conventional field memory, a RAS request signal (REQ) is internally generated in response to an external read/write request signal. In response to the RAS request signal (REQ), a RAS control signal (RAS1Z) is generated. In some cases, it is required to generate RAS controls signals in a particular order determined according to the priorities of the RAS request signals.

According to the above described conventional field memory, when a read/write request signal is inputted, for example, seven RAS request signals (REQ) are generated in the order of priority. In response to the RAS request signals, seven cycles of RAS control signal (RAS1Z) is supplied in the order of the REQ's priority. Each cycle of the RAS control signal RAS1Z has a cycle of 150 ns. The seven cycles of RAS control signal RAS1Z may include cycles for self-refreshing process. In most case, it is required that the seven cycles of the RAS control signal RAS1Z is generated in a certain period of time, such as 1200 ns. With a failure field memory, the seven cycles of the RAS control signal RAS1Z is not generated in the required period of time. The RAS control signal RAS1Z is generated inside the integrated circuit, and therefore, it is difficult to find out failure products.

OBJECTS OF THE INVENTION

Accordingly, an object of the present invention is to provide a RAS cycle monitor circuit which can determine whether RAS control signals are generated on a proper cycle.

Another object of the present invention is to provide a field memory in which it can be determined whether RAS control signals are generated on a proper cycle.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a RAS cycle monitor circuit includes a counter circuit, which counts the number of RAS control signals supplied to a DRAM core in a predetermined period of time to decide whether the RAS control signals are generated on a proper cycle.

According to a second aspect of the present invention, a field memory includes a DRAM core; a processor which generates and supplies RAS control signals to the DRAM core; and a RAS cycle monitor circuit which monitors the cycle of the RAS controls signals. The RAS cycle monitor circuit includes a counter circuit which counts the number of RAS control signals supplied to the DRAM core in a predetermined period of time to decide whether the RAS control signals are generated on a proper cycle.

According to the present invention, it can be monitored whether the cycle of RAS control signals is in an acceptable period of time.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
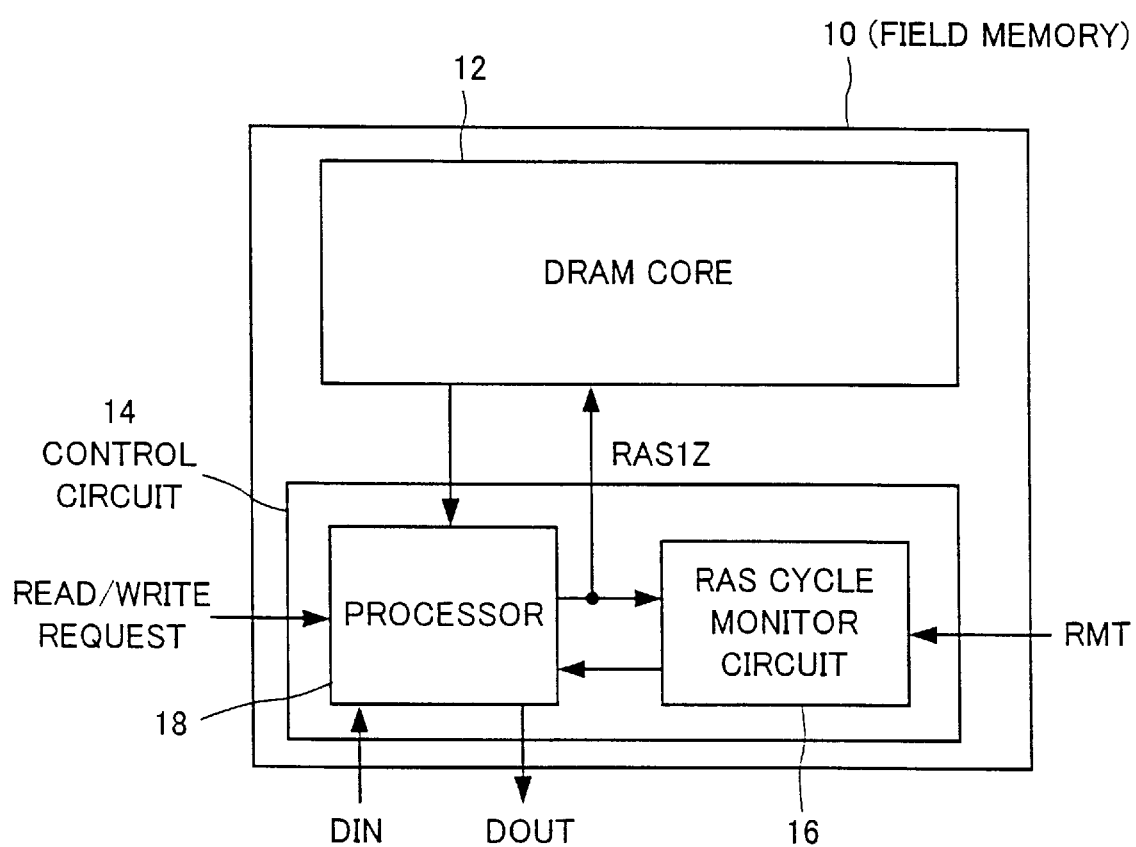
FIG. 1 is a block diagram illustrating a field memory according to the present invention.

FIG. 1 shows a field memory 10 according to the present invention, which includes a DRAM core 12 and a control circuit 14. The field memory 10 is an integrated circuit storing image data field by field. The DRAM core 12 is a memory cell array including a large number of memory cells. The control circuit 14 includes a processor 18 and a RAS cycle monitor circuit 16 which monitors the cycle of RAS control signals RAS1Z. The DRAM core 12 is connected to the processor 18 in the control circuit 14.

In the control circuit 14, the processor 18 is supplied at input terminals with a read/write request signal and with a data input signal DIN. The processor 18 outputs an output signal DOUT, including general output data and monitored data. The processor 18 is connected at an output terminal to the RAS cycle monitor circuit 16. The RAS cycle monitor circuit 16 is supplied at an input terminal with a RAS monitor request signal RMT. The processor 18 generates RAS control signals to the DRAM core 12 and RAS cycle monitor circuit 16.

According to the field memory 10, when the RAS monitor request signal RMT is supplied to the RAS cycle monitor circuit 16, the RAS cycle monitor circuit 16 starts counting the number of RAS controls signals RAS1Z supplied from the processor 18. Based on the number of the RAS control signals RAS1Z, the RAS cycle monitor circuit 16 detects or determines whether the RAS control signal RAS1Z is generated and supplied on a required cycle. The RAS cycle monitor circuit 16 supplies an output signal indicating the monitored result to the processor 18. The monitored result is outputted from the processor 18 to an external terminal DOUT, not shown.

First Preferred Embodiment

Figure 2:
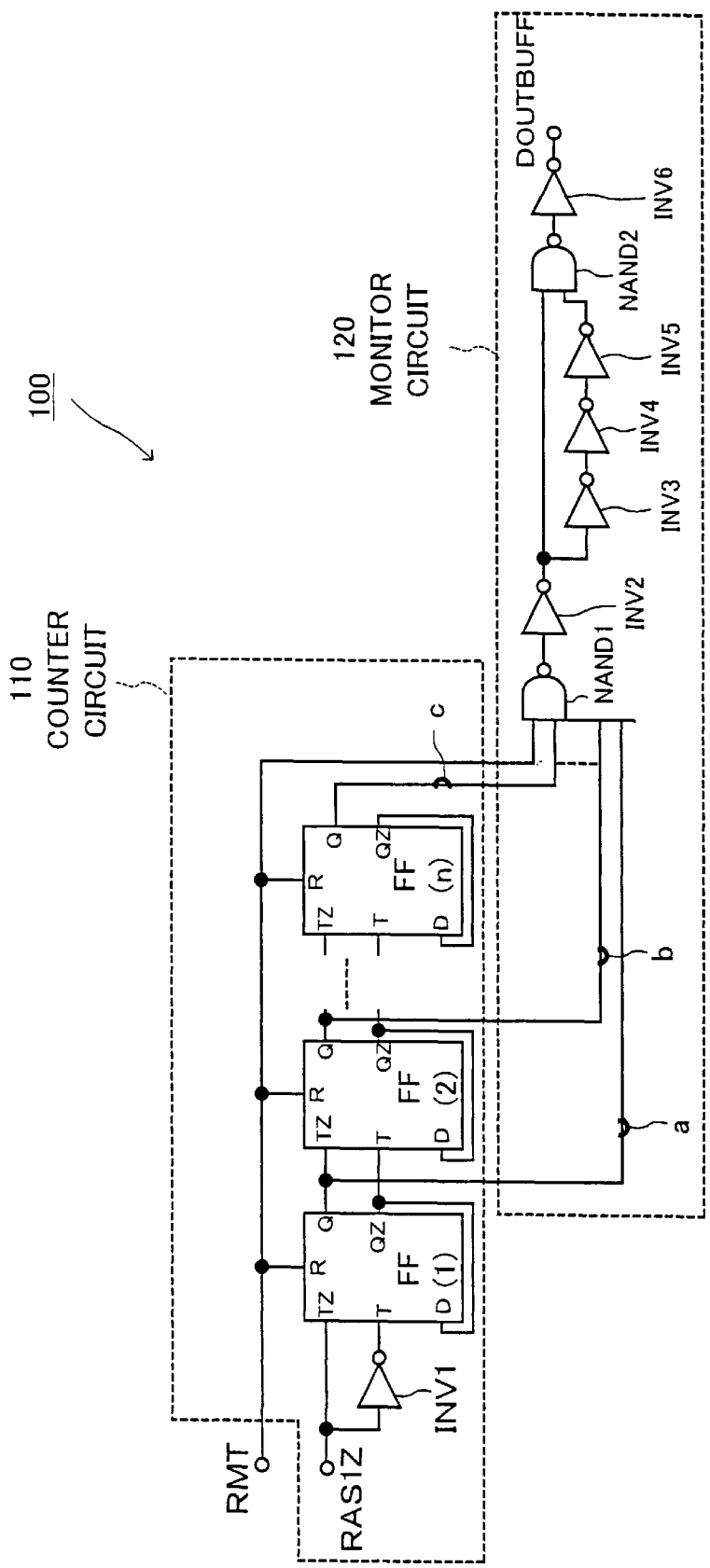
FIG. 2 is a block diagram illustrating a RAS cycle monitor circuit according to a first preferred embodiment of the present invention.

FIG. 2 shows a RAS cycle monitor circuit 100 according to a first preferred embodiment of the present invention, which includes a counter circuit 110 and a monitor circuit 120. The counter circuit 110 includes serially connected first to (n)th flip-flop circuits FF(1) to FF(n) and a first inverter INV1. The first inverter INV1 is supplied at an input terminal with a RAS control signal RAS1Z. Each of the flip-flop circuits FF(1) to FF(n) includes input terminals TZ, T, D and R, and output terminals Q and QZ. Each flip-flop circuit is supplied at the input terminal R with a monitor request signal RMT. The monitor request signal RMT is inputted from an external terminal arranged outside the integrated circuit.

The first flip-flop circuit FF(1) is supplied at the input terminal TZ with a RAS control signal RAS1Z, and is connected at the input terminal T to an output terminal of the first inverter INV1. The first flip-flop circuit FF(1) is connected at the output terminal Q to the input terminal TZ of the second flip-flop circuit FF(2) and to a node "a". The first flip-flop circuit FF(1) is connected at the output terminal QZ to the input terminal D thereof and to the input terminal T of the second flip-flop circuit FF(2).

The second flip-flop circuit FF(2) is connected at the output terminal Q to the input terminal TZ of the third flip-flop circuit, not shown, and to a node "b". The first flip-flop circuit FF(2) is connected at the output terminal QZ to the input terminal D thereof and to the input terminal T of the third flip-flop circuit. In the same manner as the first and second flip-flop circuits FF(1) and FF(2), third to (n−1)th flip-flop circuits are connected. The (n)th flip-flop circuit FF(n) is connected at the output terminal Q to a node (c), and at the output terminal QZ to the input terminal D thereof.

The monitor circuit 120 includes first and second NAND gates NAND1 and NAND2, and second to sixth inverters INV2 to INV6. The first NAND gate NAND1 has (n+1) input terminals, connected to the output terminals Qs of the flip-flop circuits FF(1) to FF(n) in the counter circuit 110. The first NAND gate NAND1 is connected at an output terminal to an input terminal of the second inverter INV2. The second inverter INV2 is connected at an output terminal to an input terminal of the third inverter INV3 and to an input terminal of the second NAND gate NAND2.

The third inverter INV3 is connected at an output terminal to an input terminal of the fourth inverter INV4. The fourth inverter INV4 is connected at an output terminal to an input terminal of the fifth inverter INV5. The fifth inverter INV5 is connected at an output terminal to the other input terminal of the second NAND gate NAND2. The second NAND gate NAND2 is connected at an output terminal to an input terminal of the sixth inverter INV6. The sixth inverter INV6 is connected at an output terminal to an output terminal DOUTBUFF.

Figure 3:
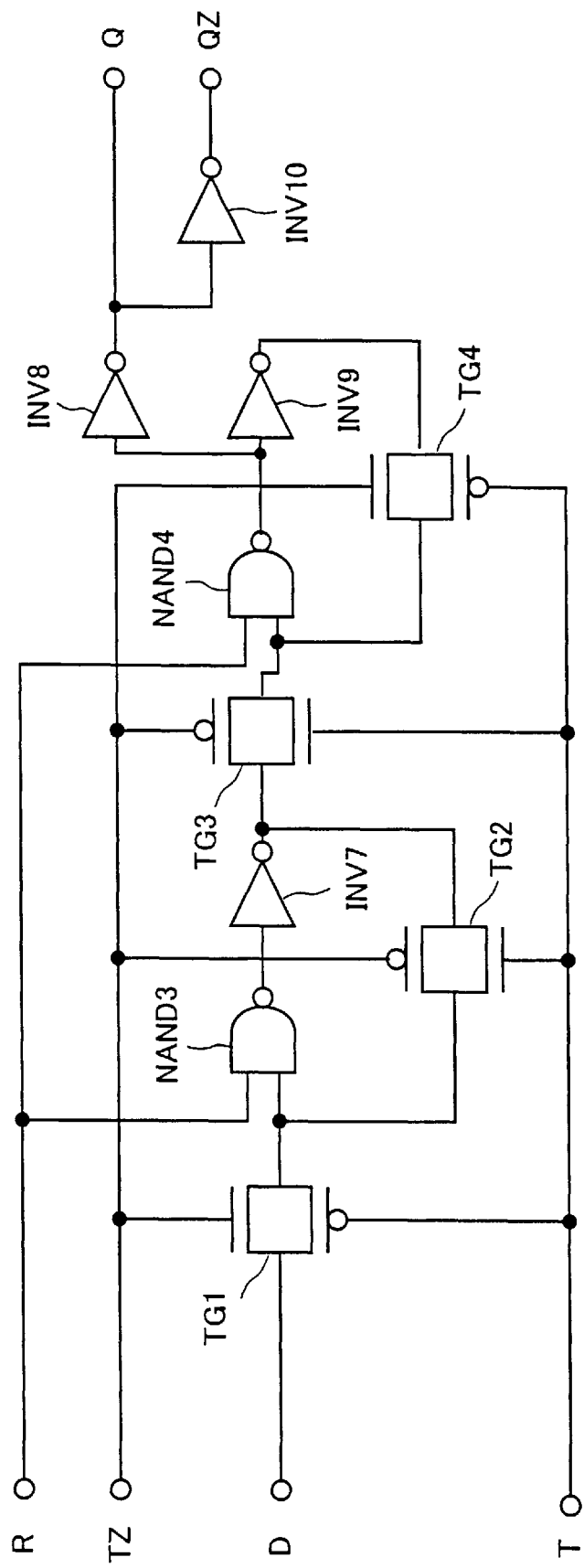
FIG. 3 is a logic diagram showing a flip-flop circuit used in the first preferred embodiment, shown in FIG. 2.

FIG. 3 is a logic diagram showing the flip-flop circuit FF(1) to FF(n) used in the counter circuit 110. The flip-flop circuit includes first to fourth transfer gates TG1 to TG4, each formed by a pair of P-channel transistor and N-channel transistor; two input type of third and fourth NAND gates NAND3 and NAND4; and seventh to tenth inverters INV7 to INV10.

The transfer gate TG1 is connected at a source to the input terminal D and at a drain to an input terminal of the third NAND gate NAND3 and to a source of the second transfer gate TG2. The N-channel transistor of the first transfer gate TG1 is connected at a gate to the input terminal TZ, while the P-channel transistor of the first transfer gate TG1 is connected at a gate to the input terminal T.

The third NAND gate NAND3 is connected at the other input terminal to the input terminal R, and at an output terminal to an input terminal of the seventh inverter INV7. The second transfer gate TG2 is connected at a drain to a source of the third transfer gate TG3 and to an output terminal of the seventh inverter INV7. Gates of the P-channel transistor and N-channel transistor of the second transfer gate TG2 are connected to the input terminals TZ and T, respectively. The seventh inverter INV7 is connected at the output terminal also to the source of the third transfer gate TG3.

The third transfer gate TG3 is connected at an output terminal to a source of the fourth transfer gate TG4 and to an input terminal of the fourth NAND gate NAND4. Gates of the P-channel transistor and N-channel transistor of the third transfer gate TG3 are connected to the input terminals TZ and T, respectively. The fourth NAND gate NAND4 is connected at the other input terminal to the input terminal R, and at an output terminal to input terminals of the eighth and ninth inverters INV8 and INV9.

The fourth transfer TG4 is connected at an output terminal to an output terminal of the ninth inverter INV9. Gates of N-channel transistor and P-channel transistor of the fourth transfer gate TG4 are connected to the input terminals TZ and T, respectively. The eighth inverter INV8 is connected at an output terminal to the output terminal Q and an input terminal of the tenth inverter INV10. The tenth inverter INV10 is connected at an output terminal to the output terminal QZ.

Figure 4:
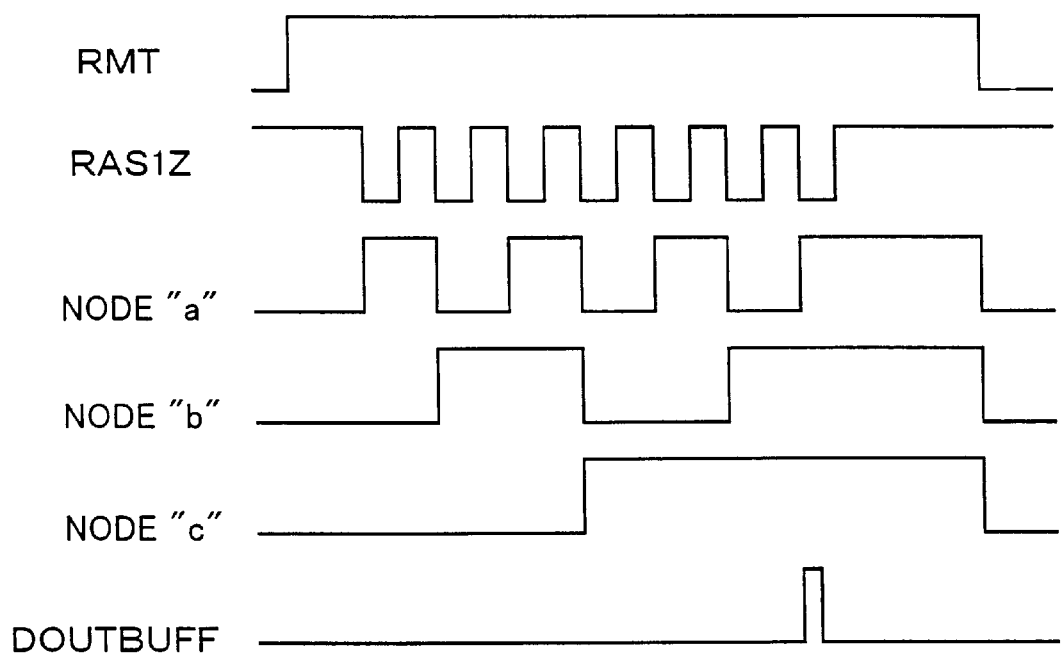
FIG. 4 is a timing chart showing the operation of the first preferred embodiment, shown in FIG. 2.

Next, the operation of the first preferred embodiment, shown in FIGS. 2 and 3, in the case where seven cycles of RAS control signal RAS1Z is monitored is described in conjunction with the flow-chart in FIG. 4. In this case, three flip-flop circuits FF(1) to FF(3) are used in the counter circuit 110. When the monitor request signal RMT turns low "L" to high "H", cycle monitor operation starts and seven cycles of RAS controls signals RAS1Z are generated. When the RAS control signal RAS1Z turns high "H" to low "L" in the first cycle, the node "a" turns low "L" to high "H". After that, the node "a" keeps such a high condition even if the RAS control signal RAS1Z turns low "L" to high "H".

When the RAS control signal RAS1Z turns high "H" to low "L" in the second cycle, the node "a" turns high "H" to low "L". After that, the node "a" keeps such a low condition even if the RAS control signal RAS1Z turns high "H" to low "L". For the node "a", the operations of the first and second cycles are repeated alternately.

The node "b" is changed in level in accordance with clocks generated with voltage level at the node "a", because the node "a" is connected to the input terminals T and TZ of the second flip-flop circuit FF(2). In other words, when the node "a" turns high "H" to low "L" (first time), the node "b" turns low "L" to high "H". Then, the node "b" turns high "H" to low "L", when the node "a" turns low "L" to high "H" (second time); and the same processes are repeated alternately. The node "c" is changed in level in accordance with clocks generated with voltage level at the node "b", because the node "b" is connected to the input terminals T and TZ of the third flip-flop circuit FF(3).

When the RAS control signal RAS1Z turns high "H" to low "L" in the seventh cycle, all of the nodes "a", "b" and "c" are high "H" in level, and the monitor request signal RMT is also "H" in level; and therefore, the output of the first NAND gate NAND1 turns high "H" to low "L". As a result, one-shot pulse is supplied to the output terminal DOUTBUFF of the monitor circuit 120. The output signal (pulse signal) is detected at a DOUT pad, which is an external terminal of the integrated circuit, to monitor the cycle of the RAS control signals RAS1Z. If the one-shot pulse is supplied to the DOUT pad within 1200 ns to 150 ns while the monitor request signal RMT is high "H", the field memory would be determined to be "PASS" and be accepted. On the other hand, if the one-shot pulse is not supplied to the DOUT pad within 1200 ns to 150 ns while the monitor request signal RMT is high "H", the field memory would be determined to be "FAIL" and not be accepted.

According to the first preferred embodiment, it can be monitored whether the cycle of RAS control signals RAS1Z is in an acceptable period of time. The monitor output signal can be detected outside the integrated circuit.

Second Preferred Embodiment

Figure 5:
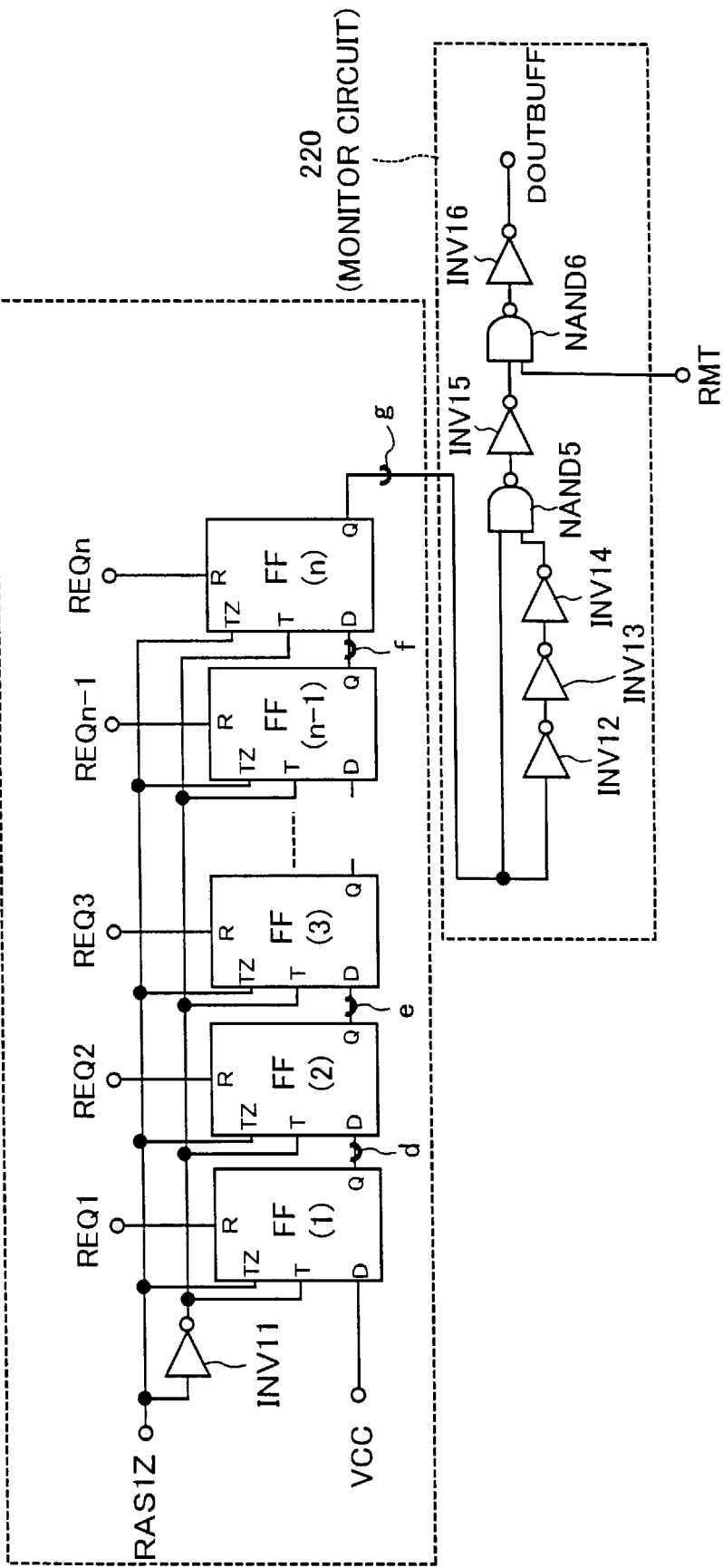
FIG. 5 is a block diagram illustrating a RAS cycle monitor circuit according to a second preferred embodiment of the present invention.

FIG. 5 is a block diagram illustrating a RAS cycle monitor circuit 200 according to a second preferred embodiment of the present invention. The RAS cycle monitor circuit 200 includes a counter circuit 210 and a monitor circuit 220.

The counter circuit 210 includes serially connected first to (n)th flip-flop circuits FF(1) to FF(n) and an inverter INV11. Each of the flip-flop circuits FF(1) to FF(n) includes input terminals TZ, T, D and R, and an output terminal Q. Each flip-flop circuit is supplied at the input terminal with a RAS control signal RAS1Z. The inverter INV11 is supplied at an input terminal TZ with a RAS control signal RAS1Z and is connected at an output terminal to the input terminals T of all the flip-flop circuits FF(1) to FF(n). The first to (n)th flip-flop circuits FF(1) to FF(n) are supplied at the input terminals R with RAS request signals REQ1 to REQn, respectively.

The first flip-flop circuit FF(1) is connected at the input terminal D to a power supply terminal VCC, and at the output terminal Q to a node "d" and to the input terminal D of the second flip-flop circuit FF(2). The second flip-flop circuit FF(2) is connected at the output terminal Q to a node "e" and to the input terminal D of the third flip-flop circuit FF(3). In such manner, the output terminal Q of the (n−1)th flip-flop circuit FF(n−1) is connected to a node "f" and to the input terminal D of the (n)th flip-flop circuit FF(n). The (n)th flip-flop circuit FF(n) is connected at the output terminal Q to a node "g". Each of the flip-flop circuits FF(1) to FF(n) is designed in the same manner as the first preferred embodiment, shown in FIG. 3.

The monitor circuit 220 includes five inverter circuits INV12 to INV16, and two-input type of NAND gates NAND5 and NAND6. The NAND gate NAND5 is connected at an input terminal to the node "g" in the counter circuit 210. The inverter INV12 is connected at an input terminal to the node "g" and at an output terminal to an input terminal of the INV13. The inverter INV13 is connected at an output terminal to an input terminal of the INV14. The inverter INV14 is connected at an output terminal to the other input terminal of the NAND gate NAND 5.

The NAND gate NAND5 is connected at an output terminal to an input terminal of the inverter INV15. The inverter INV15 is connected at an output terminal to an input terminal of the NAND gate NAND6. The NAND gate NAND6 is supplied at the other input terminal with a monitor request signal RMT, and is connected at an output terminal to an input terminal of the inverter INV16. The inverter INV16 is connected at a monitor output terminal DOUTBUFF.

Figure 6:
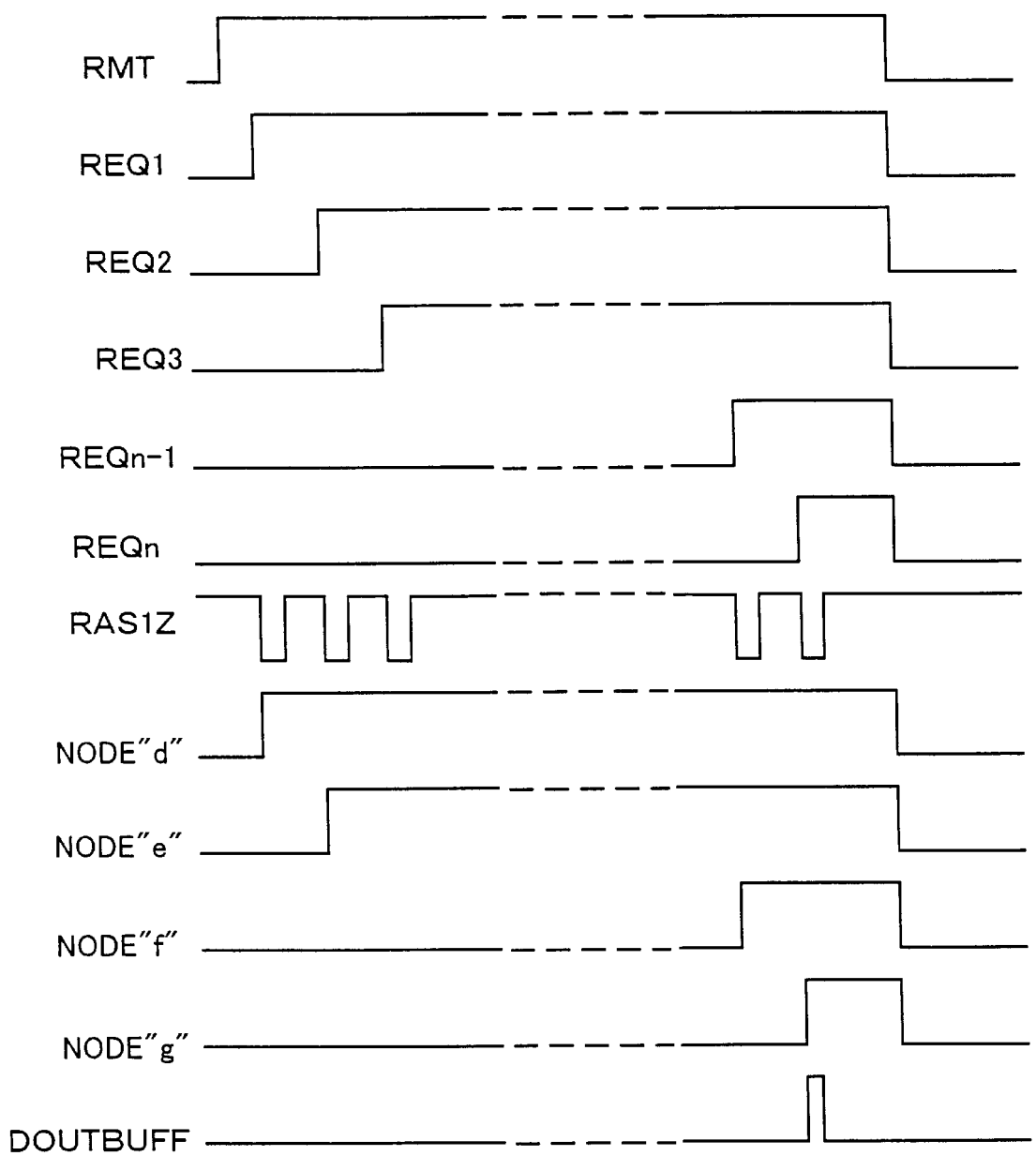
FIG. 6 is a timing chart showing the operation of the second preferred embodiment, shown in FIG. 5.

Next, the operation of the second preferred embodiment is described in conjunction with FIG. 6. When the monitor request signal RMT turns low "L" to high "H", the field memory 200 gets into a cycle monitor mode, so that RAS request signals REQ1 to REQn are generated in the order of priority. In response to the RAS request signals REQ1 to REQn, "n" cycles of RAS control signal RAS1Z is generated. The RAS request signals REQ1 to REQn keep being high "H" once turning into high "H" from low "L" until the monitor request signal RMT turns high "H" to low "L".

When the RAS request signal REQ1 turns low "L" to high "H", the RAS control signal RAS1Z turns high "H" to low "L" in the first cycle. When the RAS control signal RAS1Z turns to low "L", the first flip-flop circuit FF(1) supplies a high level signal to the second flip-flop circuit FF(2).

Subsequently, when the RAS request signal REQ2 turns low "L" to high "H", the RAS control signal RAS1Z turns high "H" to low "L" in the second cycle. As a result, the second flip-flop circuit FF(2) supplies a high level signal to the third flip-flop circuit FF(3). In the same manner, when the RAS control signal RAS1Z turns high "H" to low "L" in the (n)th cycle, the (n)th flip-flop circuit FF(n) outputs a high level signal.

When the output of the flip-flop circuit FF(n) turns to high "H", one-shot pulse is supplied to the output terminal DOUTBUFF. If "n" cycle of the RAS control signal RAS1Z is not generated in a acceptable period of time in response to the RAS request signals REQ1 to REQn, inputted in the order of priority, no pulse signal would outputted to the terminal DOUTBUFF.

The signal supplied to the output terminal DOUTBUFF is transferred to an external terminal DOUT so that the cycle of the RAS control signal RAS1Z can be monitored from outside the field memory. The one-shot pulse is supplied to the output terminal DOUTBUFF immediately after the RAS control signal RAS1Z turns to high "H" in the (n)th cycle. Therefore, if the one-shot pulse is generated while the cycle monitor signal RMT is high "H" in level, the field memory would be determined to be "PASS" and be accepted.

According to the second preferred embodiment, it can be monitored outside of the integrated circuit whether the cycle of RAS control signals RAS1Z is in an acceptable period of time. In addition, it can be monitored outside of the integrated circuit whether the RAS request signals REQ1 to REQn are generated in the proper order and in an acceptable period of time.

Third Preferred Embodiment

Figure 7:
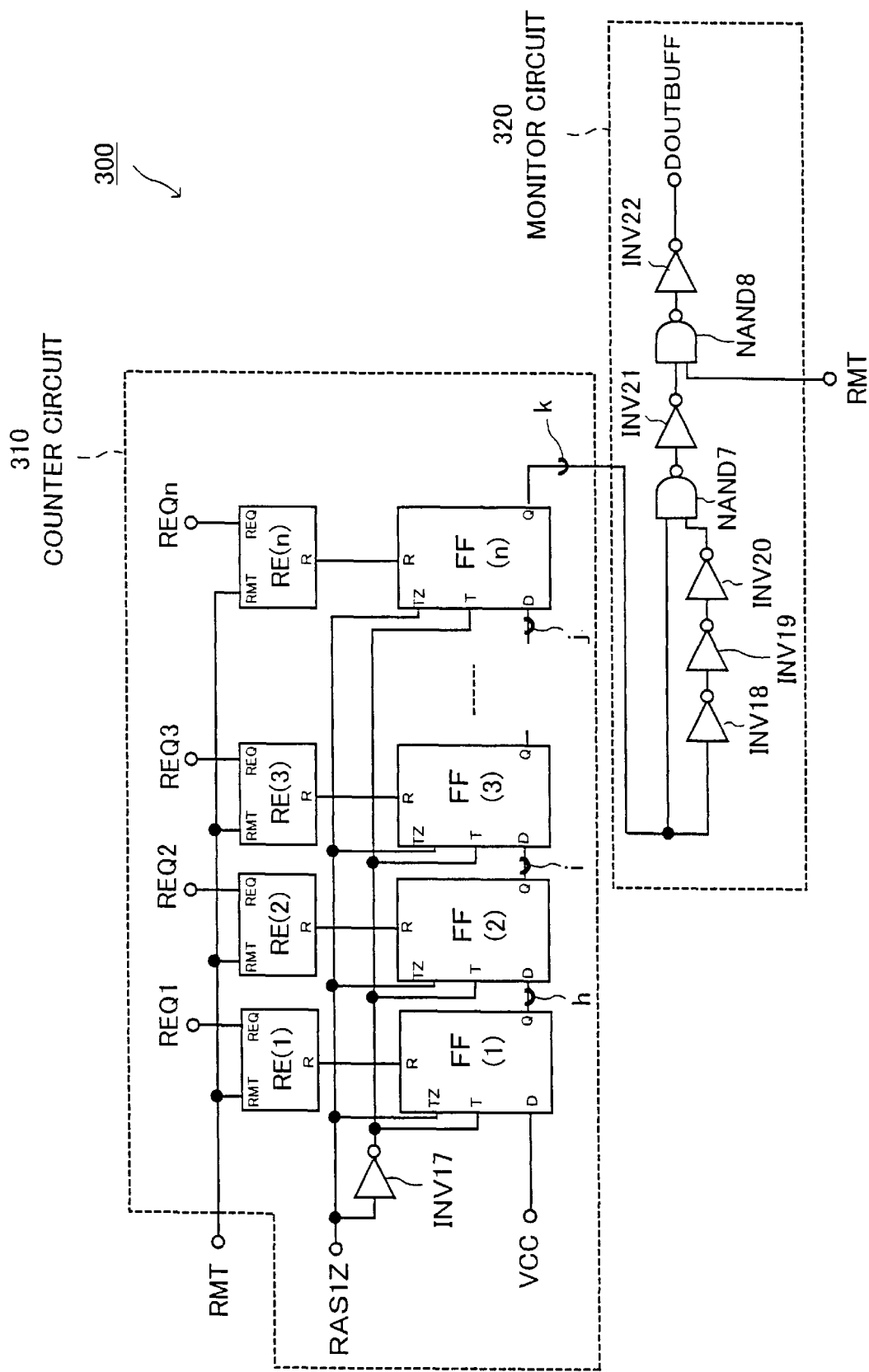
FIG. 7 is a block diagram illustrating a RAS cycle monitor circuit according to a third preferred embodiment of the present invention.

FIG. 7 is a block diagram illustrating a RAS cycle monitor circuit 300 according to a third preferred embodiment of the present invention. The RAS cycle monitor circuit 300 includes a counter circuit 310 and a monitor circuit 320.

The counter circuit 310 includes serially connected first to (n)th flip-flop circuits FF(1) to FF(n), first to (n)th RAS request latch circuits RE(1) to RE(n), and an inverter INV17. Each of the flip-flop circuits FF(1) to FF(n) includes input terminals TZ, T, D and R, and an output terminal Q. Each flip-flop circuit is supplied at the input terminal TZ with a RAS control signal RAS1Z. The inverter INV17 is supplied at an input terminal with a RAS control signal RAS1Z and is connected at an output terminal to the input terminals T of all the flip-flop circuits FF(1) to FF(n).

Each of the first to (n)th RAS request latch circuits RE(1) to RE(n) includes input terminals RMT and REQ, and an output terminal R. Each RAS request latch circuit is supplied at the input terminal RMT with a monitor request signal RMT.

The first RAS request latch circuit RE(1) is supplied at the other input terminal with a RAS request signal REQ1, and is connected at the output terminal R to the input terminal R of the first flip-flop circuit FF(1). The second RAS request latch circuit RE(2) is supplied at the other input terminal with a RAS request signal REQ2, and is connected at the output terminal R to the input terminal R of the second flip-flop circuit FF(2). The third RAS request latch circuit RE(3) is supplied at the other input terminal with a RAS request signal REQ3, and is connected at the output terminal R to the input terminal R of the third flip-flop circuit FF(3). In the same manner, the (n)th RAS request latch circuit RE(n) is supplied at the other input terminal with a RAS request signal REQn, and is connected at the output terminal R to the input terminal R of the (n)th flip-flop circuit FF(n).

The first flip-flop circuit FF(1) is connected at the input terminal D to a power supply terminal VCC, and at the output terminal Q to a node "h" and to the input terminal D of the second flip-flop circuit FF(2). The second flip-flop circuit FF(2) is connected at the output terminal Q to a node "i" and to the input terminal D of the third flip-flop circuit FF(3). In such manner, the output terminal Q of the (n−1)th flip-flop circuit FF(n−1) is connected to a node "j" and to the input terminal D of the (n)th flip-flop circuit FF(n). The (n)th flip-flop circuit FF(n) is connected at the output terminal Q to a node "k". Each of the flip-flop circuits FF(1) to FF(n) is designed in the same manner as the first preferred embodiment, shown in FIG. 3.

The monitor circuit 320 includes five inverters INV18 to INV22, and two-input type of NAND gates NAND7 and NAND8. The NAND gate NAND7 is connected at an input terminal to the node "k" in the counter circuit 310. The inverter INV18 is connected at an input terminal to the node "k" and at an output terminal to an input terminal of the INV19. The inverter INV19 is connected at an output terminal to an input terminal of the INV20. The inverter INV20 is connected at an output terminal to the other input terminal of the NAND gate NAND7.

The NAND gate NAND7 is connected at an output terminal to an input terminal of the inverter INV21. The inverter INV21 is connected at an output terminal to an input terminal of the NAND gate NAND8. The NAND gate NAND8 is supplied at the other input terminal with a monitor request signal RMT, and is connected at an output terminal to an input terminal of the inverter INV22. The inverter INV22 is connected at a monitor output terminal DOUTBUFF.

Figure 8:
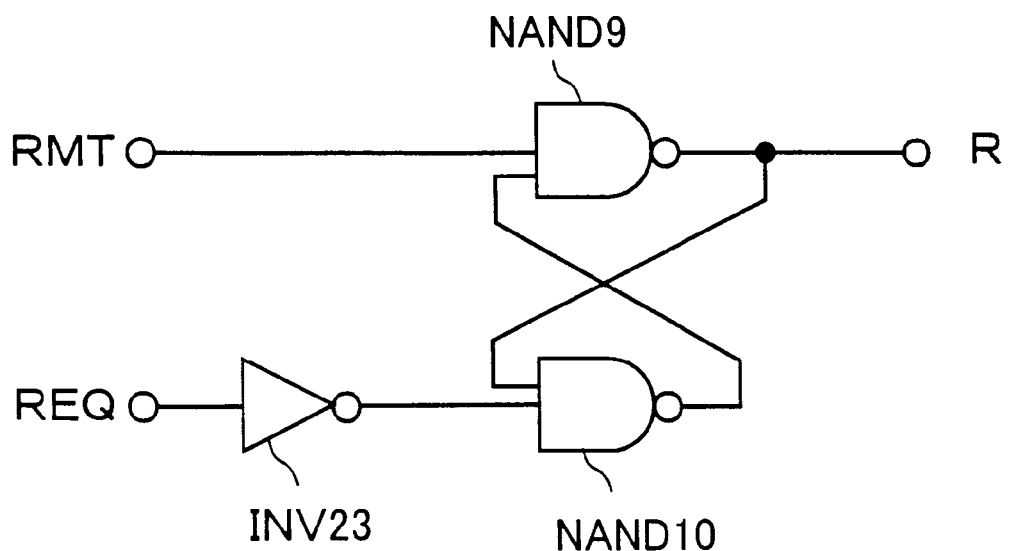
FIG. 8 is a logic diagram showing a latch circuit used in the third preferred embodiment, shown in FIG. 7.

FIG. 8 shows a RAS request latch circuit RE(1) to RE(n). The latch circuit includes two-input type of NAND gates NAND9 and NAND10, and an inverter INV23. The NAND gate NAND9 is connected at an input terminal with the input terminal RMT of the latch circuit, and at an output terminal to an input terminal of the NAND gate NAND10 and to the output terminal R of the latch circuit. The inverter INV23 is connected at an input terminal to the input terminal REQ of the latch circuit, and at an output terminal to the other input terminal of the NAND gate NAND10. The NAND gate NAND10 is connected at an output terminal to the other input terminal of the NAND gate NAND9.

Figure 9:
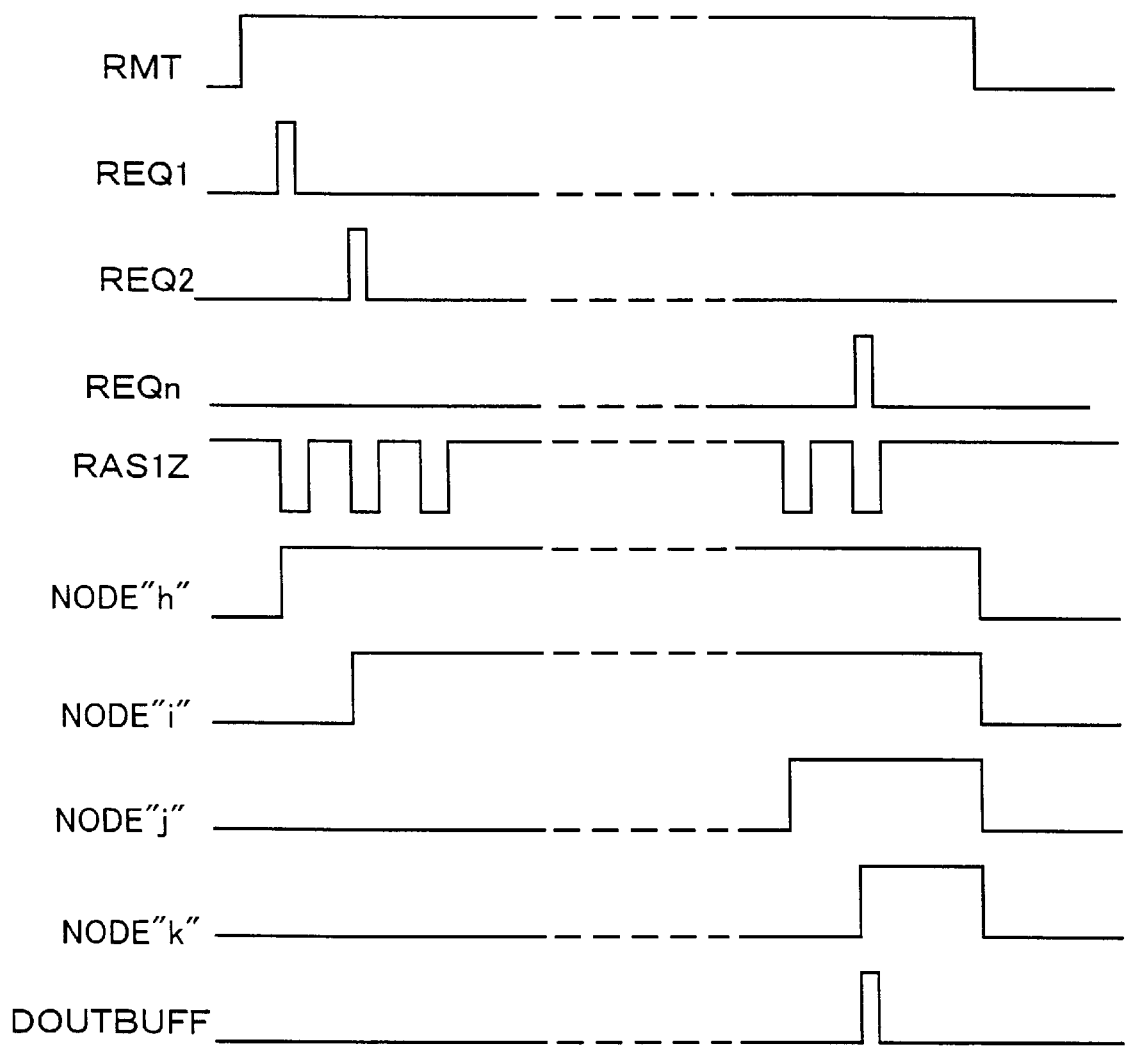
FIG. 9 is a timing chart showing the operation of the third preferred embodiment, shown in FIG. 7.

Next, the operation of the third preferred embodiment is described in conjunction with FIG. 9. When the monitor request signal RMT turns low "L" to high "H", the field memory 300 gets into a cycle monitor mode, so that the RAS request signals REQ1 to REQn are generated in the order of priority. The RAS request signals REQ1 to REQn are pulse signals. In response to the RAS request signals REQ1 to REQn, "n" cycles of RAS control signal RAS1Z is generated.

When the RAS request signal REQ1 turns low "L" to high "H", RAS control signal RAS1Z and output signal of the inverter INV17 are supplied to the input terminals TZ and T of the first flip-flop circuit FF(1), respectively. When the RAS control signal RAS1Z turns high "H" to low "L" in the first cycle, the output Q of the first flip-flop circuit FF(1) turns low "L" to high "H" and is supplied to the input terminal D of the second flip-flop circuit (2).

Next, when the RAS request signal REQ2 turns low "L" to high "H", the RAS control signal RAS1Z and output signal of the inverter INV17 are supplied to the input terminals TZ and T of the second flip-flop circuit FF(2), respectively. When the RAS control signal RAS1Z turns high "H" to low "L" in the second cycle, the output Q of the second flip-flop circuit FF(2) turns low "L" to high "H" and is supplied to the input terminal D of the third flip-flop circuit (3). In the same manner, when the RAS control signal RAS1Z turns high "H" to low "L" in the (n)th cycle, the output of the (n)th flip-flop circuit FF(n) turns low "L" to high "H".

Subsequently, one-shot pulse is supplied to the monitor output terminal DOUTBUFF, because the monitor request signal RMT supplied to the monitor circuit 320 is high in level. The signal supplied to the output terminal DOUTBUFF is transferred to an external terminal DOUT so that the cycle of the RAS control signal RAS1Z can be monitored outside the field memory. The one-shot pulse is supplied to the output terminal DOUTBUFF immediately after the RAS control signal RAS1Z turns to high "H" in the (n)th cycle. Therefore, if the one-shot pulse is generated while the cycle monitor signal RMT is high "H" in level, the field memory would be determined to be "PASS" and be accepted.

According to the third preferred embodiment, it can be monitored outside the field memory whether the cycle of RAS control signals RAS1Z is in an acceptable period of time. In addition, it can be monitored outside the field memory (integrated circuit) whether the RAS request signals REQ1 to REQn are generated in the proper order and in an acceptable period of time.

Fourth Preferred Embodiment

Figure 10:
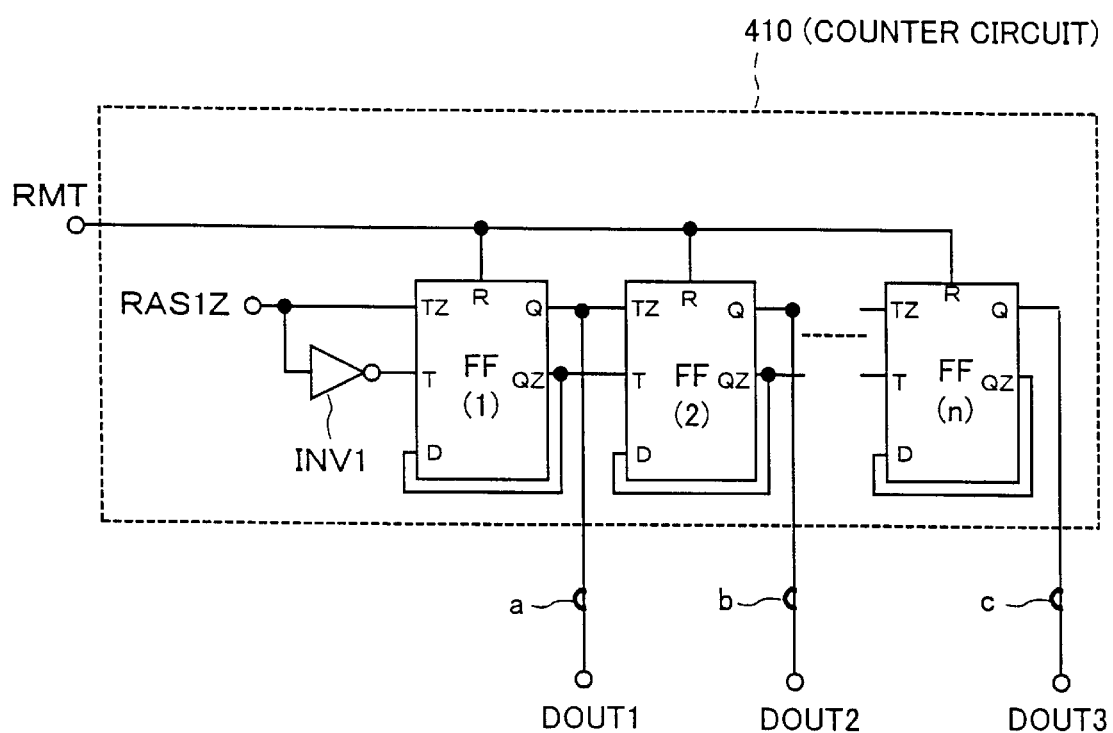
FIG. 10 is a block diagram illustrating a RAS cycle monitor circuit according to a fourth preferred embodiment of the present invention.

FIG. 10 shows a RAS cycle monitor circuit 400 according to a fourth preferred embodiment of the present invention, which includes a counter circuit 410. The counter circuit 410 includes serially connected first to (n)th flip-flop circuits FF(1) to FF(n) and a first inverter INV1. The first inverter INV1 is supplied at an input terminal with a RAS control signal RAS1Z. Each of the flip-flop circuits FF(1) to FF(n) includes input terminals TZ, T, D and R, and output terminals Q and QZ. Each flip-flop circuit is supplied at the input terminal R with a monitor request signal RMT. The monitor request signal RMT is inputted from an external terminal arranged outside the integrated circuit.

The first flip-flop circuit FF(1) is supplied at the input terminal TZ with a RAS control signal RAS1Z, and is connected at the input terminal T to an output terminal of the first inverter INV1. The first flip-flop circuit FF(1) is connected at the output terminal Q to the input terminal TZ of the second flip-flop circuit FF(2) and to a node "a". The first flip-flop circuit FF(1) is connected at the output terminal QZ to the input terminal D thereof and to the input terminal T of the second flip-flop circuit FF(2).

The second flip-flop circuit FF(2) is connected at the output terminal Q to the input terminal TZ of the third flip-flop circuit, not shown, and to a node "b". The first flip-flop circuit FF(2) is connected at the output terminal QZ to the input terminal D thereof and to the input terminal T of the third flip-flop circuit. In the same manner as the first and second flip-flop circuits FF(1) and FF(2), third to (n-1)th flip-flop circuits are connected. The (n)th flip-flop circuit FF(n) is connected at the output terminal Q to a node "c", and at the output terminal QZ to the input terminal D thereof.

The nodes "a", "b" and "c" are connected to external output terminals DOUT1, DOUT2 and DOUT3, respectively. Those terminals DOUT1, DOUT2 and DOUT3 are arranged outside of the field memory, as shown in FIG. 1.

Figure 11:
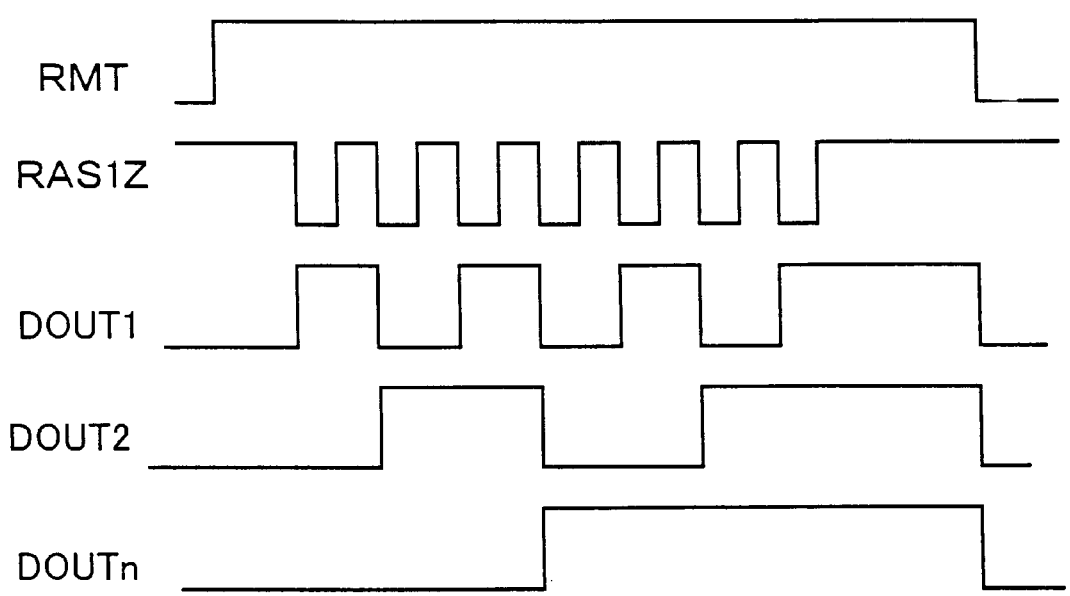
FIG. 11 is a timing chart showing the operation of the fourth preferred embodiment, shown in FIG. 10.

Next, the operation of the fourth preferred embodiment, shown in FIG. 10, in the case where seven cycles of RAS control signal RAS1Z is monitored is described in conjunction with the flow-chart in FIG. 11. In this case, three flip-flop circuits FF(1) to FF(3) are used in the counter circuit 310. When the monitor request signal RMT turns low "L" to high "H", cycle monitor operation starts and seven cycles of RAS controls signals RAS1Z are generated. When the RAS control signal RAS1Z turns high "H" to low "L" in the first cycle, the node "a" turns low "L" to high "H". After that, the node "a" keeps such a high condition even if the RAS control signal RAS1Z turns low "L" to high "H".

When the RAS control signal RAS1Z turns high "H" to low "L" in the second cycle, the node "a" turns high "H" to low "L". After that, the node "a" keeps such a low condition even if the RAS control signal RAS1Z turns high "H" to low "L". For the node "a", the operations of the first and second cycles are repeated alternately.

The node "b" is changed in level in accordance with clocks generated with the voltage level at the node "a", because the node "a" is connected to the input terminals T and TZ of the second flip-flop circuit FF(2). In other words, when the node "a" turns high "H" to low "L" (first time), the node "b" turns low "L" to high "H". Then, the node "b" turns high "H" to low "L", when the node "a" turns low "L" to high "H" (second time); and the same processes are repeated alternately. The node "c" is changed in level in accordance with clocks generated with voltage level at the node "b", because the node "b" is connected to the input terminals T and TZ of the third flip-flop circuit FF(3).

When the RAS control signal RAS1Z turns high "H" to low "L" in the seventh cycle, all of the nodes "a", "b" and "c", connected to the output terminals DOUT1 to DOUT3, are high "H" in level, and the monitor request signal RMT is also "H" in level.

It is assumed that seven of 150 ns cycle of the RAS control signal RAS1Z must be generated within 1200 ns in normal operation. If high signals "H" are supplied to all of the monitor output terminals DOUT1 to DOUT3 within 1200 ns to 150 ns while the monitor request signal RMT is high "H", the field memory would be determined to be "PASS" and be accepted.

According to the fourth preferred embodiment, it can be monitored whether the cycle of RAS control signals RAS1Z is in an acceptable period of time. The monitor output signal can be detected outside the field memory (integrated circuit).

Fifth Preferred Embodiment

Figure 12:
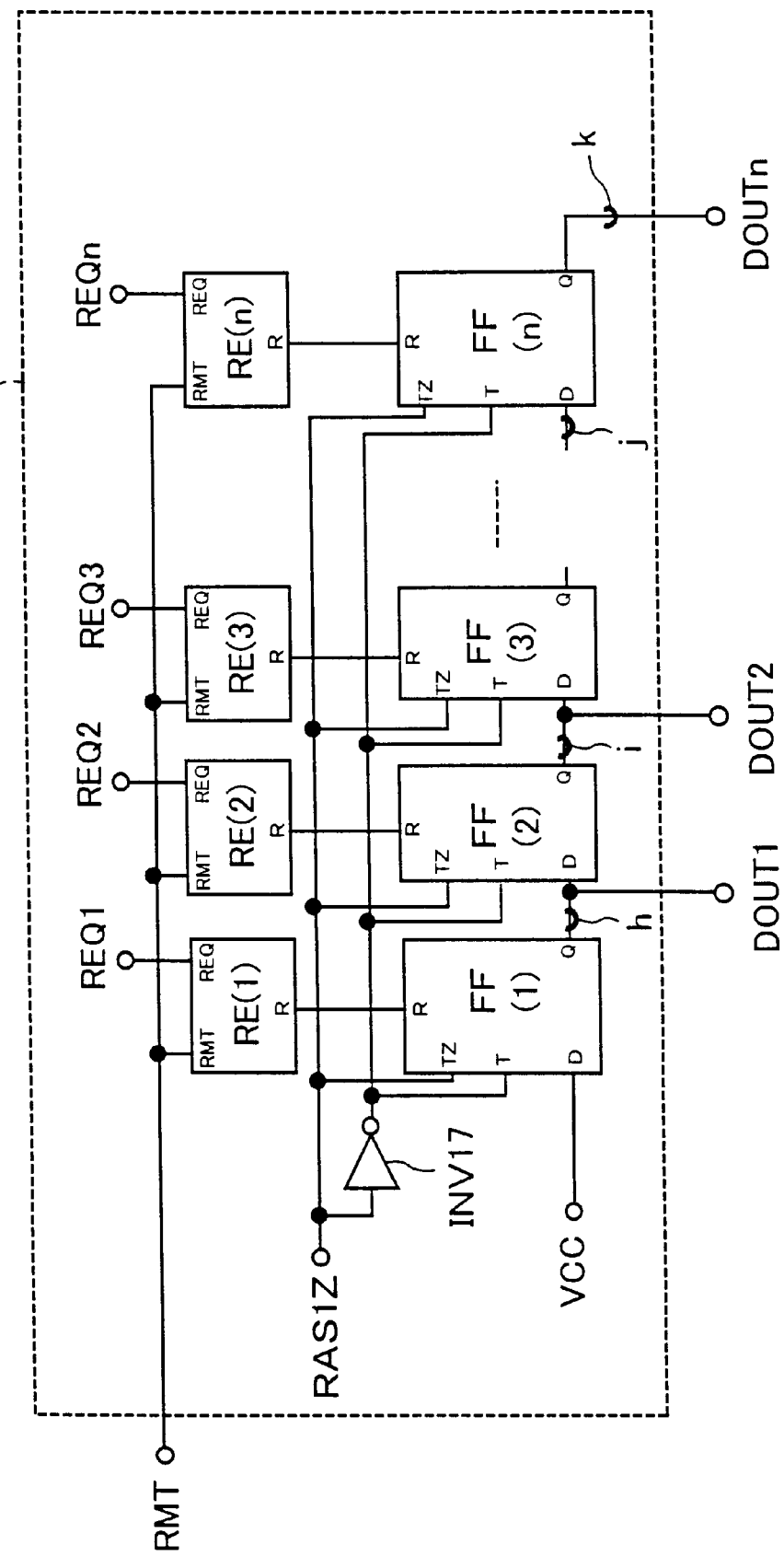
FIG. 12 is a block diagram illustrating a RAS cycle monitor circuit according to a fifth preferred embodiment of the present invention.

FIG. 12 is a block diagram illustrating a RAS cycle monitor circuit 500 according to a fifth preferred embodiment of the present invention. The RAS cycle monitor circuit 500 includes a counter circuit 510.

The counter circuit 510 includes serially connected first to (n)th flip-flop circuits FF(1) to FF(n), first to (n)th RAS request latch circuits RE(1) to RE(n), and an inverter INV17. Each of the flip-flop circuits FF(1) to FF(n) includes input terminals TZ, T, D and R, and an output terminal Q. Each flip-flop circuit is supplied at the input terminal TZ with a RAS control signal RAS1Z. The inverter INV17 is supplied at an input terminal with a RAS control signal RAS1Z and is connected at an output terminal to the input terminals T of all the flip-flop circuits FF(1) to FF(n).

Each of the first to (n)th RAS request latch circuits RE(1) to RE(n) includes input terminals RMT and REQ, and an output terminal R. Each RAS request latch circuit is supplied at the input terminal RMT with a monitor request signal RMT.

The first RAS request latch circuit RE(1) is supplied at the other input terminal with a RAS request signal REQ1, and is connected at the output terminal R to the input terminal R of the first flip-flop circuit FF(1). The second RAS request latch circuit RE(2) is supplied at the other input terminal with a RAS request signal REQ2, and is connected at the output terminal R to the input terminal R of the second flip-flop circuit FF(2). The third RAS request latch circuit RE(3) is supplied at the other input terminal with a RAS request signal REQ3, and is connected at the output terminal R to the input terminal R of the third flip-flop circuit FF(3). In the same manner, the (n)th RAS request latch circuit RE(n) is supplied at the other input terminal with a RAS request signal REQn, and is connected at the output terminal R to the input terminal R of the (n)th flip-flop circuit FF(n).

The first flip-flop circuit FF(1) is connected at the input terminal D to a power supply terminal VCC, and at the output terminal Q to a node "h" and to the input terminal D of the second flip-flop circuit FF(2). The second flip-flop circuit FF(2) is connected at the output terminal Q to a node "i" and to the input terminal D of the third flip-flop circuit FF(3). In such manner, the output terminal Q of the (n-1)th flip-flop circuit FF(n-1) is connected to a node "j" and to the input terminal D of the (n)th flip-flop circuit FF(n). The (n)th flip-flop circuit FF(n) is connected at the output terminal Q to a node "k". The nodes "h", "i", "j" and "k" are connected to monitor output terminals DOUT1 to DOUTn, respectively. The monitor output terminals DOUT1 to DOUTn are arranged outside of the field memory.

Each of the flip-flop circuits FF(1) to FF(n) is designed in the same manner as the first preferred embodiment, shown in FIG. 3. Each of the RAS request latch circuits RE(1) to RE(n) is designed in the same manner as the third preferred embodiment, shown in FIG. 8.

Figure 13:
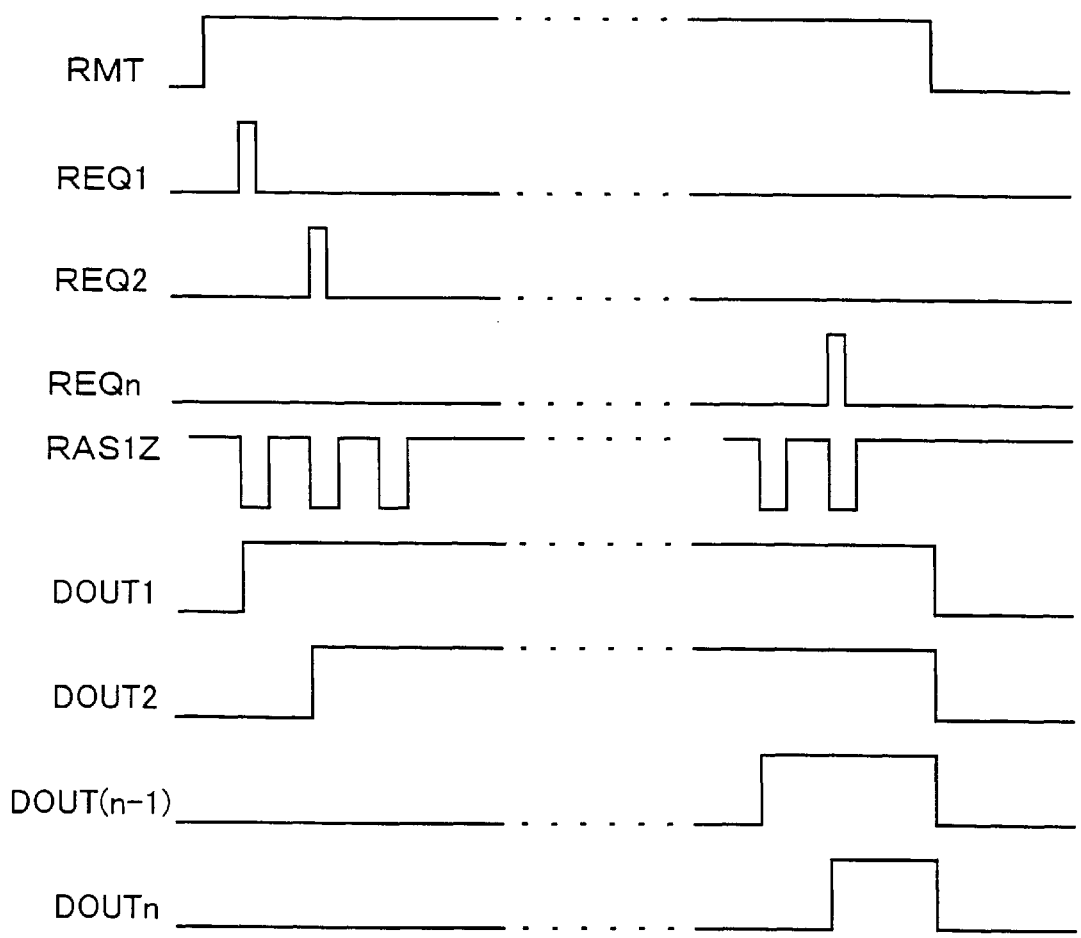
FIG. 13 is a timing chart showing the operation of the fifth preferred embodiment, shown in FIG. 12.

Next, the operation of the fifth preferred embodiment is described in conjunction with FIG. 13. When the monitor request signal RMT turns low "L" to high "H", the field memory 500 gets into a cycle monitor mode, so that the RAS request signals REQ1 to REQn are generated in the order of priority. The RAS request signals REQ1 to REQn are pulse signals. In response to the RAS request signals REQ1 to REQn, a RAS control signal RAS1Z is generated for "n" cycles.

When the RAS request signal REQ1 turns low "L" to high "H", RAS control signal RAS1Z and output signal of the inverter INV17 are supplied to the input terminals TZ and T of the first flip-flop circuit FF(1), respectively. When the RAS control signal RAS1Z turns high "H" to low "L" in the first cycle, the output Q of the first flip-flop circuit FF(1) turns low "L" to high "H" and is supplied to the input terminal D of the second flip-flop circuit (2).

Next, when the RAS request signal REQ2 turns low "L" to high "H", the RAS control signal RAS1Z and output signal of the inverter INV17 are supplied to the input terminals TZ and T of the second flip-flop circuit FF(2), respectively. When the RAS control signal RAS1Z turns high "H" to low "L" in the second cycle, the output Q of the second flip-flop circuit FF(2) turns low "L" to high "H" and is supplied to the input terminal D of the third flip-flop circuit (3). In the same manner, when the RAS control signal RAS1Z turns high "H" to low "L" in the (n)th cycle, the output of the (n)th flip-flop circuit FF(n) turns low "L" to high "H".

It is assumed that seven of 150 ns cycle of the RAS control signal RAS1Z must be generated within 1200 ns in normal operation. If a high signal "H" is supplied to the monitor output terminal DOUT7 within 1200 ns to 150 ns while the monitor request signal RMT is high "H", the field memory would be determined to be "PASS" and be accepted.

According to the fifth preferred embodiment, in the cycle monitor mode, the RAS request signals REQ turn to high "H" in the order of higher priority alternately. It can be monitored whether a certain number of cycles of the RAS control signal RAS1Z is generated in an acceptable period of time. The monitor output signal can be detected outside the field memory (integrated circuit).

Although the first to third preferred embodiments are designed to generate one shot pulse supplied to the output terminal DOUTBUFF and DOUT1 to DOUTn, non-pulse signals which turns low "L" to high "H" or high "H" to low "L" can be generated to be supplied to those output terminals.

What is claimed is:

1. A RAS cycle monitor circuit, in which a RAS control signal is generated in an integrated circuit and is supplied to a DRAM core, comprising:
   a counter circuit which counts the number of cycles of a RAS control signal supplied to the DRAM core in a predetermined period of time to decide whether the RAS control signal is generated on a proper cycle.

2. The RAS cycle monitor circuit according to claim 1, further comprising:
   a monitor circuit which detects whether the number of cycles of the RAS control signal is in a normal operation range and supplies a monitor output signal to an external terminal.

3. The RAS cycle monitor circuit according to claim 2, wherein
   the counter circuit comprises serially connected plural flip-flop circuits, an input terminal of each of which is supplied with the RAS control signal.

4. The RAS cycle monitor circuit according to claim 3, wherein
   each of the flip-flop circuits is supplied at the input terminal with the RAS control signal and at another input terminal with a monitor request signal, and
   the counter circuit starts counting the number of cycles of the RAS control signal in response to the monitor request signal.

5. The RAS cycle monitor circuit according to claim 4, wherein
   the counter circuit further comprises an inverter, which is supplied at an input terminal with the RAS control signal and has an output terminal connected to another input terminal of each of the flip-flop circuits.

6. The RAS cycle monitor circuit according to claim 3, wherein
   the monitor circuit comprises a logic gate having input terminals connected to output terminals of the flip-flop circuits and an output terminal connected to an external circuit.

7. The RAS cycle monitor circuit according to claim 3, wherein
   the counter circuit comprises RAS request terminals connected to input terminals of the flip-flop circuits one-to-one so that each flip-flop circuit is supplied with a different priority of RAS request signal.

8. The RAS cycle monitor circuit according to claim 7, wherein
   the counter circuit further comprises an inverter, which is supplied at an input terminal with the RAS control signal and is connected at an output terminal to another input terminal of each of the flip-flop circuits.

9. The RAS cycle monitor circuit according to claim 8, wherein
   the monitor circuit comprises a logic gate having a first input terminal connected to an output terminal of the last flip-flop circuit; a second input terminal supplied with a monitor request signal; and an output terminal for connection to an external circuit.

10. The RAS cycle monitor circuit according to claim 3, wherein
    the counter circuit further comprises RAS request latch circuits having output terminals connected to input terminals of the flip-flop circuits, each RAS request latch circuit having input terminals supplied with a monitor request signal and a RAS request signal, respectively.

11. The RAS cycle monitor circuit according to claim 10, wherein
    the counter circuit further comprises an inverter, which is supplied at an input terminal with the RAS control signal and is connected at an output terminal to another input terminal of each of the flip-flop circuits.

12. The RAS cycle monitor circuit according to claim 10, wherein
    the monitor circuit comprises a logic gate having a first input terminal connected to an output terminal of the last flip-flop circuit; a second input terminal supplied with a monitor request signal; and an output terminal for connection to an external circuit.

13. The RAS cycle monitor circuit according to claim 1, wherein
    the counter circuit comprises serially connected plural flip-flop circuits, an input terminal of each of which is supplied with the RAS control signal.

14. The RAS cycle monitor circuit according to claim 13, wherein
    each of the flip-flop circuits is supplied at the input terminal with the RAS control signal and at another input terminal with a monitor request signal, and
    the counter circuit starts counting the number of cycles of the RAS control signal in response to the monitor request signal.

15. The RAS cycle monitor circuit according to claim 14, wherein the counter circuit further comprises an inverter, which is supplied at an input terminal with the RAS control signal and has an output terminal connected to another input terminal of each of the flip-flop circuits.

16. The RAS cycle monitor circuit according to claim 13, wherein an output terminal of each of the flip-flop circuits is connected to an external terminal.

17. The RAS cycle monitor circuit according to claim 1, wherein the counter circuit comprises:
(1) serially connected plural flip-flop circuits, an input terminal of each of which is supplied with the RAS control signal; and
(2) RAS request latch circuits connected at output terminals to input terminals of the flip-flop circuits, each RAS request latch circuit having input terminals supplied with a monitor request signal and a RAS request signal, respectively.

18. The RAS cycle monitor circuit according to claim 17, wherein the counter circuit further comprises an inverter, which is supplied at an input terminal with the RAS control signal and is connected at an output terminal to another input terminal of each of the flip-flop circuits.

19. The RAS cycle monitor circuit according to claim 17, wherein an output terminal of each of the flip-flop circuits is connected to an external terminal.

20. A RAS-cycle monitor circuit, in which a RAS control signal is generated in an integrated circuit and is supplied to a DRAM core, comprising:

a counter circuit which counts the number of cycles of a RAS control signal supplied to the DRAM core in a predetermined period of time; and a monitor circuit which detects whether the number of cycles of the RAS control signal is in a normal operation range in accordance with an output signal from the counter circuit, wherein the counter circuit comprises:
(1) serially connected plural flip-flop circuits each of which is supplied at an input terminal with the RAS control signal, and at another input terminal with a monitor request signal; and
(2) an inverter which is supplied at an input terminal with the RAS control signal and is connected at an output terminal to another input terminal of each of the flip-flop circuits; and the monitor circuit comprises a logic gate having input terminals connected to output terminals of the flip-flop circuits and an output terminal connected to an external circuit.

21. A RAS cycle monitor circuit, in which a RAS control signal is generated in an integrated circuit and is supplied to a DRAM core, comprising:

a counter circuit which counts the number of cycles of a RAS control signal supplied to the DRAM core in a predetermined period of time; and a monitor circuit which detects whether the number of cycles of the RAS control signal is in a normal operation range, wherein the counter circuit comprises:
(1) serially connected plural flip-flop circuits, input terminal of each of which is supplied with the RAS control signal;
(2) RAS request terminals connected to input terminals of the flip-flop circuits one to one so that each flip-flop circuit is supplied with a different priority of RAS request; and
(3) an inverter, which is supplied at an input terminal with the RAS control signal and is connected at an output terminal to another input terminal of each of the flip-flop circuits, wherein the monitor circuit comprises a logic gate having a first input terminals connected to an output terminal of the most downward flip-flop circuit; a second input terminal supplied with a monitor request signal; and an output terminal connected to an external circuit.

22. A RAS cycle monitor, in which a RAS control signal is generated in an integrated circuit and is supplied to a DRAM core, comprising:

a counter circuit which counts the number of cycles of a RAS control signal supplied to the DRAM core in a predetermined period ot time; and a monitor circuit which detects whether the number of cycles of the RAS control signal jis in a normal operation range, wherein the counter circuit comprises:
(1) serially connected plural flip-flop circuits, input terminal of each of which is supplied with the RAS control signal;
(2) RAS request latch circuits connected to output terminals to input terminals of the flip-flop circuits, each RAS request latch circuit having input terminals supplied with a monitor request signal and a RAS request signal, respectively; and
(3) an inverter, which is supplied at an input terminal with the RAS control signal and is connected at an output terminal to another input terminal of each of the flip-flop circuits, the monitor circuit comprises a logic gate having a first input terminals connected to an output terminal of the most downward flip-flop circuit; a second input terminal supplied with a monitor request signal; and an output terminal connected to an external circuit.

23. A RAS cycle monitor circuit, in which a RAS control signal is generated in an integrated circuit and is supplied to a DRAM core, comprising:

a counter circuit which comprises serially connected plural flip-flop circuits and an inverter to count the number of cycles of a RAS control signal supplied to the DRAM core in a predetermined period of time, wherein each of the flip-flop circuits comprises input terminals supplied with the RAS control signal and a monitor request signal and an output terminal connected to an external terminal outside the integrated circuit, the inverter is supplied at an input terminal with the RAS control signal and is connected at an output terminal to another input terminal of each of the flip-flop circuits.

24. A RAS-cycle monitor circuit, in which a RAS control signal is generated in an integrated circuit and is supplied to a DRAM core, comprising:

a counter circuit which counts the number of cycles of a RAS control signal supplied to the DRAM core in a predetermined period of time, wherein the counter circuit comprises:
(1) serially connected plural flip-flop circuits, input terminal of each of which is supplied with the RAS control signal;

(2) RAS request latch circuits connected at output terminals to input terminals of the flip-flop circuits, each RAS request latch circuit having input terminals supplied with a monitor request signal and a RAS request signal, respectively; and (3) an inverter, which is supplied at an input terminal with the RAS control signal and is connected at an output terminal to another input terminal of each of the flip-flop circuits, wherein each of the flip-flop circuits is connected at an output terminal to an external terminal outside the integrated circuit.

25. A field memory, comprising:

a DRAM core;

a processor which generates and supplies a RAS control signal to the DRAM core; and a RAS cycle monitor circuit which monitors the cycle of the RAS controls signals, wherein the RAS cycle monitor circuit comprises a counter circuit which counts the number of cycles of the RAS control signal supplied to the DRAM core in a predetermined period of time to decide whether the RAS control signals are generated on a proper cycle.

26. The field memory according to claim 25, wherein the RAS cycle monitor circuit further comprises a monitor circuit which detects whether the number of cycles of the RAS control signal is in a normal operation range and supplies a monitor output signal to an external terminal.

27. The field memory according to claim 26, wherein the counter circuit comprises serially connected plural flip-flop circuits, an input terminal of each of which is supplied with the RAS control signal.

28. The field memory according to claim 27, wherein each of the flip-flop circuits is supplied at the input terminal with the RAS control signal and at another input terminal with a monitor request signal, and the counter circuit starts counting the number of cycles of the RAS control signal in response to the monitor request signal.

29. The field memory according to claim 28, wherein the counter circuit further comprises an inverter, which is supplied at an input terminal with the RAS control signal and is connected at an output terminal to another input terminal of each of the flip-flop circuits.

30. The field memory according to claim 27, wherein the monitor circuit comprises a logic gate having input terminals connected to output terminals of the flip-flop circuits and an output terminal connected to the external terminal.

31. The field memory according to claim 27, wherein the counter circuit comprises RAS request terminals connected to input terminals of the flip-flop circuits one-to-one so that each flip-flop circuit is supplied with a different priority of RAS request signal.

32. The field memory according to claim 31, wherein the counter circuit further comprises an inverter, which is supplied at an input terminal with the RAS control signal and has an output terminal connected to another input terminal of each of the flip-flop circuits.

33. The field memory according to claim 32, wherein the monitor circuit comprises a logic gate having a first input terminal connected to an output terminal of the last flip-flop circuit; a second input terminal supplied with a monitor request signal; and an output terminal for connection to an external circuit.

34. The field memory according to claim 27, wherein the counter circuit further comprises RAS request latch circuits having output terminals connected to input terminals of the flip-flop circuits, each RAS request latch circuit having input terminals supplied with a monitor request signal and a RAS request signal, respectively.

35. The field memory according to claim 34, wherein the counter circuit further comprises an inverter, which is supplied at an input terminal with the RAS control signal and is connected at an output terminal to another input terminal of each of the flip-flop circuits.

36. The field memory according to claim 34, wherein the monitor circuit comprises a logic gate having a first input terminal connected to an output terminal of the last flip-flop circuit; a second input terminal supplied with a monitor request signal; and an output terminal for connection to an external circuit.

37. The field memory according to claim 25, wherein the counter circuit comprises serially connected plural flip-flop circuits, an input terminal of each of which is supplied with the RAS control signal.

38. The field memory according to claim 37, wherein each of the flip-flop circuits is supplied at the input terminal with the RAS control signal and at another input terminal with a monitor request signal, and the counter circuit starts counting the number of cycles of the RAS control signal in response to the monitor request signal.

39. The field memory according to claim 38, wherein the counter circuit further comprises an inverter, which is supplied at an input terminal with the RAS control signal and has an output terminal connected to another input terminal of each of the flip-flop circuits.

40. The field memory according to claim 37, wherein an output terminal of each of the flip-flop circuits is connected to an external terminal.

41. The field memory according to claim 25, wherein the counter circuit comprises:

(1) serially connected plural flip-flop circuits, an input terminal of each of which is supplied with the RAS control signal; and (2) RAS request latch circuits having output terminals connected to input terminals of the flip-flop circuits, each RAS request latch circuit having input terminals supplied with a monitor request signal and a RAS request signal, respectively.

42. The field memory according to claim 41, wherein the counter circuit further comprises an inverter, which is supplied at an input terminal with the RAS control signal and is connected at an output terminal to another input terminal of each of the flip-flop circuits.

43. The field memory according to claim 41, wherein an output terminal of each of the flip-flop circuits is connected to an external terminal.

44. A field memory, comprising:

a DRAM core;

a processor which generates and supplies a RAS control signal to the DRAM core; and a RAS cycle monitor circuit which monitors the cycle of the RAS control signal, wherein the RAS cycle monitor circuit comprises:

a) a counter circuit which counts the number of cycles of the RAS control signal supplied to the DRAM core in a predetermined period of time; and b) a monitor circuit which detects whether the number of cycles of the RAS control signal is in a normal operation range in accordance with an output signal from the counter circuit, wherein the counter circuit comprises:
(1) serially connected plural flip-flop circuits each of which is supplied at an input terminal with the RAS control signal, and at another input terminal with a monitor request signal; and
(2) an inverter which is supplied at an input terminal with the RAS control signal and is connected at an output terminal to another input terminal of each of the flip-flop circuits, and
the monitor circuit comprises a logic gate having input terminals connected to output terminals of the flip-flop circuits and an output terminal connected to an external circuit.

45. A field memory, comprising:

a DRAM core;

a processor which generates and supplies a RAS control signal to the DRAM core; and a RAS cycle monitor circuit which monitors the cycle of the RAS controls signal, wherein the RAS cycle monitor circuit comprises:
a) a counter circuit which counts the number of cycles of the RAS control signal supplied to the DRAM core in a predetermined period of time; and
b) a monitor circuit which detects whether the number of cycles of the RAS control signal is in a normal operation range, wherein the counter circuit comprises:
(1) serially connected plural flip-flop circuits, input terminal of each of which is supplied with the RAS control signal;
(2) RAS request terminals connected to input terminals of the flip-flop circuits one to one so that each flip-flop circuit is supplied with a different priority of RAS request; and
(3) an inverter, which is supplied at an input terminal with the RAS control signal and is connected at an output terminal to another input terminal of each of the flip-flop circuits, wherein
the monitor circuit comprises a logic gate having a first input terminals connected to an output terminal of the most downward flip-flop circuit; a second input terminal supplied with a monitor request signal; and an output terminal connected to an external circuit.

46. A field memory, comprising:

a DRAM core;

a processor which generates and supplies a RAS control signal to the DRAM core; and a RAS cycle monitor circuit which monitors the cycle of the RAS controls signal, wherein the RAS cycle monitor circuit comprises:
a) a counter circuit which counts the number of cycles of the RAS control signal supplied to the DRAM core in a predetermined period of time; and
b) a monitor circuit which detects whether the number of cycles of the RAS control signal is in a normal operation range, wherein the counter circuit comprises:
(1) serially connected plural flip-flop circuits, input terminal of each of which is supplied with the RAS control signal;
(2) RAS request latch circuits connected at output terminals to input terminals of the flip-flop circuits, each RAS request latch circuit having input terminals supplied with a monitor request signal and a RAS request signal, respectively; and
(3) an inverter, which is supplied at an input terminal with the RAS control signal and is connected at an output terminal to another input terminal of each of the flip-flop circuits, the monitor circuit comprises a logic gate having a first input terminals connected to an output terminal of the most downward flip-flop circuit; a second input terminal supplied with a monitor request signal; and an output terminal connected to an external circuit.

47. A field memory, comprising:

a DRAM core;

a processor which generates and supplies a RAS control signal to the DRAM core; and a RAS cycle monitor circuit which monitors the cycle of the RAS controls signals, wherein the RAS cycle monitor circuit comprises a counter circuit which comprises serially connected plural flip-flop circuits and an inverter to count the number of cycles of the RAS control signal supplied to the DRAM core in a predetermined period of time, wherein each of the flip-flop circuits comprises input terminals supplied with the RAS control signal and a monitor request signal and an output terminal connected to an external terminal outside the integrated circuit, and the inverter is supplied at an input terminal with the RAS control signal and is connected at an output terminal to another input terminal of each of the flip-flop circuits.

48. A field memory, comprising:

DRAM core;

a processor which generates and supplies a RAS control signal to the DRAM core; and a RAS cycle monitor circuit comprises a counter circuit, which counts the number of cycles of the RAS control signal supplied to the DRAM core in a predetermined period of time, to monitor the cycle of the RAS control signal, wherein the counter circuit comprises:
(1) serially connected plural flip-flop circuits, input terminal of each of which is supplied with the RAS control signal;
(2) RAS request latch circuits connected at output terminals to input terminals of the flip-flop circuits, each RAS request latch circuit having input terminals supplied with a monitor request signal and a RAS request signal, respectively; and
(3) an inverter, which is supplied at an input terminal with the RAS control signal and is connected at an output terminal to another input terminal of each of the flip-flop circuits, wherein each of the flip-flop circuits is connected at an output terminal to an external terminal outside the integrated circuit.

* * * * *